(12) United States Patent
Muller et al.

(10) Patent No.: US 7,979,225 B2
(45) Date of Patent: Jul. 12, 2011

(54) METHOD AND SYSTEM OF TESTING DEVICE SENSITIVITY

(75) Inventors: Stephen A. Muller, Santa Clara, CA (US); Xiao-Ding Cai, Fremont, CA (US); Agustin Del Alamo, San Diego, CA (US); James M. Frei, Sunol, CA (US)

(73) Assignee: Oracle America, Inc., Redwood City, CA (US)

( * ) Notice: Subject to any disclaimer, the term of this patent is extended or adjusted under 35 U.S.C. 154(b) by 433 days.

(21) Appl. No.: 12/140,390

(22) Filed: Jun. 17, 2008

(65) Prior Publication Data

US 2009/0312972 A1    Dec. 17, 2009

(51) Int. Cl.
*G01N 37/00* (2006.01)
(52) U.S. Cl. .......................................................... 702/82
(58) Field of Classification Search .................. 702/82; 455/67.11, 226.2; 356/237.1; 375/259; 714/724, 714/736, 743, 738; 324/750.25, 762.01, 762.02; 365/201

See application file for complete search history.

(56) References Cited

U.S. PATENT DOCUMENTS

| | | | |
|---|---|---|---|
| 5,327,437 A * | 7/1994 | Balzer | 714/736 |
| 7,203,460 B2 | 4/2007 | Boose et al. | |
| 7,209,722 B2 * | 4/2007 | Huhtala | 455/226.2 |
| 2004/0120406 A1 * | 6/2004 | Searles et al. | 375/259 |
| 2006/0133291 A1 * | 6/2006 | Kim et al. | 370/252 |
| 2006/0146318 A1 * | 7/2006 | Adam et al. | 356/237.1 |

* cited by examiner

*Primary Examiner* — Drew A Dunn
*Assistant Examiner* — Xiuquin Sun
(74) *Attorney, Agent, or Firm* — Brooks Kushman P.C.

(57) ABSTRACT

Method and system that test device sensitivity according to whether the device passes or fails when subjected to a test signal. The device may be repeatedly subjected to test signal at varying operating parameters in order to assess pass-fail threshold at which the device transitions from operating properly/improperly to operating improperly/properly.

20 Claims, 2 Drawing Sheets

METHOD AND SYSTEM OF TESTING DEVICE SENSITIVITY

BACKGROUND

1. Field of the Invention

The present invention relates to methods and systems of device testing of the type that rely on adjusting operating parameters in order to assess a pass-fail threshold.

2. Background Art

Receiver sensitivity defines high speed link budget and device performance under stressed conditions that emulate true system environments. Measuring the sensitivity level of high speed serial receivers in a bench top test setup accurately and with repeatability while minimizing test time is a difficult challenge.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION

Figure 1:
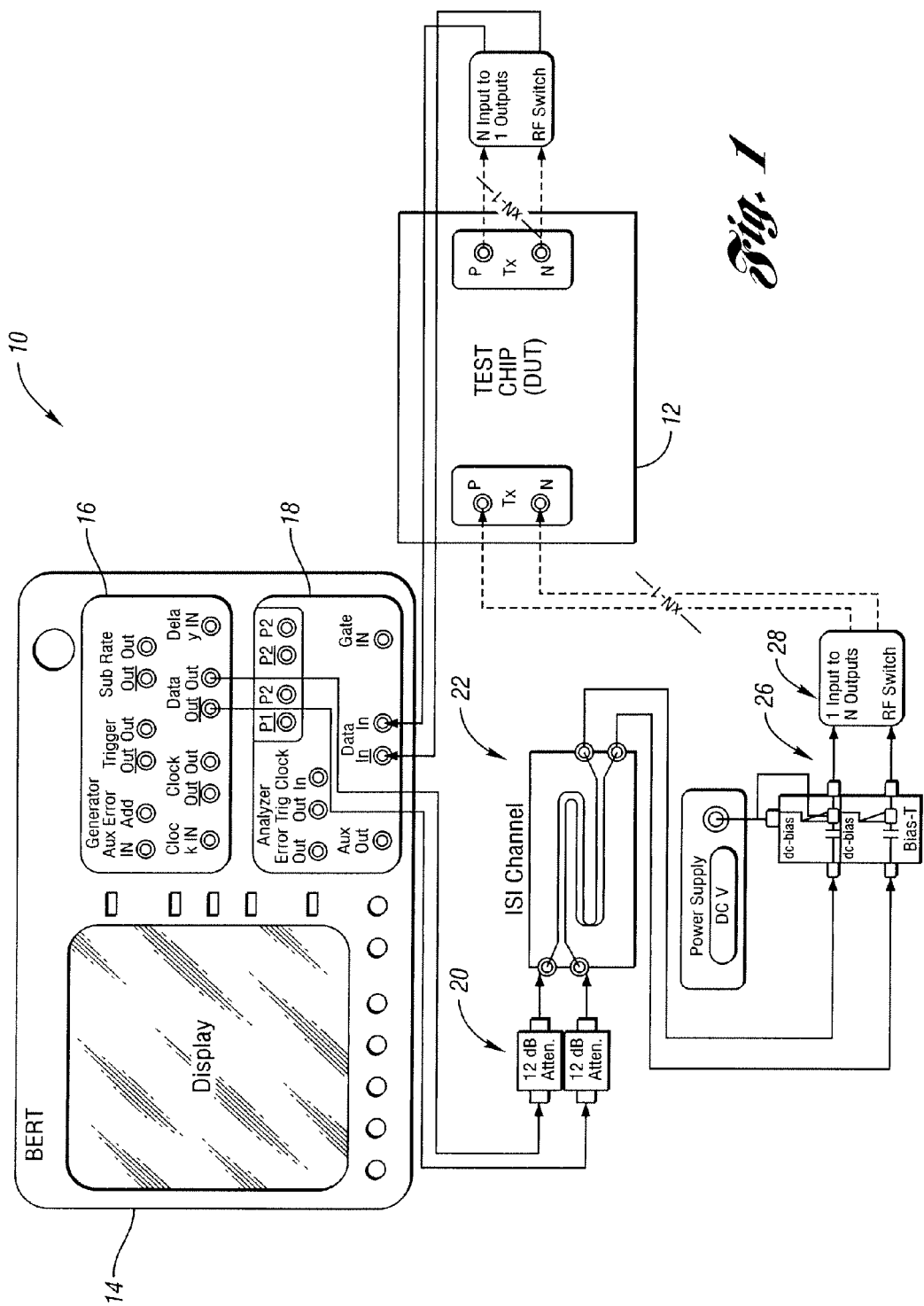
FIG. 1 illustrates a test system in accordance with one non-limiting aspect of the present invention.

FIG. 1 illustrates a test system 10 in accordance with one non-limiting aspect of the present invention. The system 10 may be configured to facilitate testing of high speed data receiver and transceiver devices/circuits, generally referred to as a device under test (DUT) 12. The DUT 12 may be embodied in a printed circuit board, chip, or other packaging. One non-limiting aspect of the present invention contemplates accurately testing the sensitivity of the DUT 12 to voltage and timing variations by analyzing a DUT pattern outputted from the DUT 12 in response to a test signal inputted to the DUT 12.

The test signal may be generated with a bit error rate tester (BERT) 14. The BERT 14 may include a pattern generator 16 and pattern analyzer 18. The generator 16 may be configured to generate a test signal. The analyzer 18 may be configured to analyze the output of the DUT 12 when subjected to the test signal. Test software may be included to facilitate programming operates the generator 16 and facilitating analysis of the DUT pattern. The test software may be configured and programmed to control operations of the BERT in order to perform the steps and analysis contemplated by the present invention.

The BERT 14 may be configured to output any type of test signal. The present invention is not intended to be limited to any particular test signal. For exemplary purposes, one non-limiting aspect of the present invention contemplates the test signal being a differential signal. The differential signal may be modulated or otherwise controlled to test specific operations of the DUT 12. The testing software may be pre-programmed with any number of testing patterns such that the software may automatically select the test signal to correspond with the DUT 12 and the type of testing that is to be conducted.

The test signal generated by the BERT 14 may not be able to subject the DUT 12 to differential signals below a threshold minimum. The dynamic output range of some BERTs 14 may be limited to certain valid operating ranges. An attenuator 20 may be included to attenuate the test signal and increase the valid operating range. The attenuator 20 can be selected and/or controlled to decrease both the minimum and maximum value of the test signal so that DUT 12 can be tested at lower voltage amplitudes. If the differential data output range of the BERT 14 is too coarse or the valid operating range is not low enough, variable attenuators 20 can be used to achieve the desired voltage step size and to decrease the lowest achievable voltage amplitude. Otherwise a fixed attenuator could suffice. This can allow standard test instruments to be used inside of its specified range of operation while still achieving output voltage swings that are sufficiently reduced in order to test the DUT 12 to failure.

The output of the attenuators 20 may be connected to a printed circuit board (PCB), wiring board, inter symbol interference (ISI) board, or other device 22 having sufficient capabilities to add a type of deterministic timing noise or jitter that is present in many environments in which the DUT 12 may operate to the test signal. The purpose of this ISI board 22 is to subject the receiver 12 to increased amounts of ISI jitter by testing with increased trace lengths and or various types of signal patterns sent from the BERT. The ISI test board 22 can consist of numerous differential signal paths whose inputs and outputs are brought out to high bandwidth RF connectors like SMA or SMP style connectors.

The connection between the attenuator output 20 and the ISI test board may be achieved with the use of high bandwidth phase matched RF coaxial cables of whatever type the test equipment and ISI board 22 dictate. Some commercially available pattern generators have ISI test boards 22 built in to the test unit as an option. Whether the ISI board 22 is internal to the BERT 14 or if it is an external entity, as shown, the connection may be achieved in the same manner. The operation and influence of the ISI board 22 shall be well understood so that its effects can be taken in to account during analysis and/or simulation.

The differential output RF connectors of the ISI board 22 may be connected to the input of a wide bandwidth bias-T device 26. The bias-T 26 may in concept consist of a capacitor (not shown) and an inductor (not shown). The capacitor may be connected in series between the input and output of the device to block a DC component of the test signal. The inductor may be connected between the output of the device and a third terminal to which a DC voltage may be connected. The DC voltage may be applied via an external power supply. This DC supply may directly set the bias point for the DUT 12. The inductor may be used to prevent high frequencies from passing through while at the same time allowing high speed signal to propagate from the input terminal to the output terminal of the bias-T 26 with the correct DC bias point.

The bias-T 26 characteristics, namely the frequency characteristics of the capacitor and inductor, may be chosen appropriately for the data rate(s) being tested. A particular bias voltage may need to be present on the differential signals in order for a DC coupled DUT 12 to function properly, i.e., BERT 14 generated DC component may need to be removed and replaced with another specified DC component if the BERT 14 cannot be properly adjusted to produce the desired DC component. If only AC coupled receivers 12 were to be tested, then the bias-T 26 may be unnecessary. The DC bias point of the test signal would be set to 0V in reference to ground and the RF output connectors of the ISI board 22 could be connected directly to the inputs of an RF switch 28 or to the receiver under test 12, depending on the implementation.

The bias-Ts 26 may be used to externally set the DC bias point after the attenuators 20. It has been found that pattern generators can have varying output characteristics at different DC bias set points due to the physical design of the BERT 14 output driver circuitry. If the DUT 12 is to be tested over a range of DC bias set points it may be important to isolate these changing effects from the receiver under test 12. Using the bias-T 26 approach isolates the DUT 12 by allowing a fixed optimal set point to be chosen for the DC bias point of the BERT 14 and also allows the DC bias point to be set directly without having to compensate for losses due to attenuation.

The bias-Ts 26 may be connected after the attenuators 20 and the ISI test board 22 since the DC component of the signal being sent to the DUT 12 may also be reduced in the presence of the attenuators 20, just as the signal amplitude is decreased. The same can be true for the ISI board 22 but to a much lesser degree. In order for DC coupled systems to be tested at a specified DC bias point, either the BERT 14 DC bias point should be adjusted upwards in order to compensate for the attenuator 20 and ISI board 22 DC losses or the DC bias point should be set using the bias-Ts 26 as described.

The bias-T 26 output terminals may be connected via another pair of phase matched RF coaxial cables to either the DUT 12 or to the inputs of an N to 1 high bandwidth switch matrix 28. The switch matrix 28 may be used to facilitate testing of multiple DUT 12 outputs by directing the test signal to any number of other DUTs 12 or different test sites of the same DUT 12. This may be useful in allowing multiple channels to be tested as part of an automated test program without having to physically move cable connections. The switch matrix 28 may be capable of handling the high bandwidth signals with little impact on the signal fidelity. For a differential high speed channel, two N to 1 switch matrices may be used to deliver the BERT 14 output signals to the N number of DUT 12 inputs. And similarly, two N to 1 switch matrices may be used to deliver the retransmitted N number of DUT 12 output signals to the error detector input on the BERT 14.

The above described ability to controllably provide the DUT 12 with a known test signal allows the present invention to accurately test and measure the response of the DUT 12. One advantage of the present invention is that it may allow the use of existing gigabit speed test equipment (BERT) to reliably and accurately measure the sensitivity of high speed serial devices in the presences of both voltage and timing stresses. This configuration can be used to implement a time variable controlled searching algorithm for injecting voltage stresses and allows simultaneous timing stresses that be controlled in both frequency and amplitude.

The above arrangement, however, is shown for exemplary purposes only and is not intended to limit the scope and contemplation of the present invention. The present invention fully contemplates the use of any arrangement and number of other features to facilitate testing receivers and other DUTs under any number of conditions.

Figure 2:
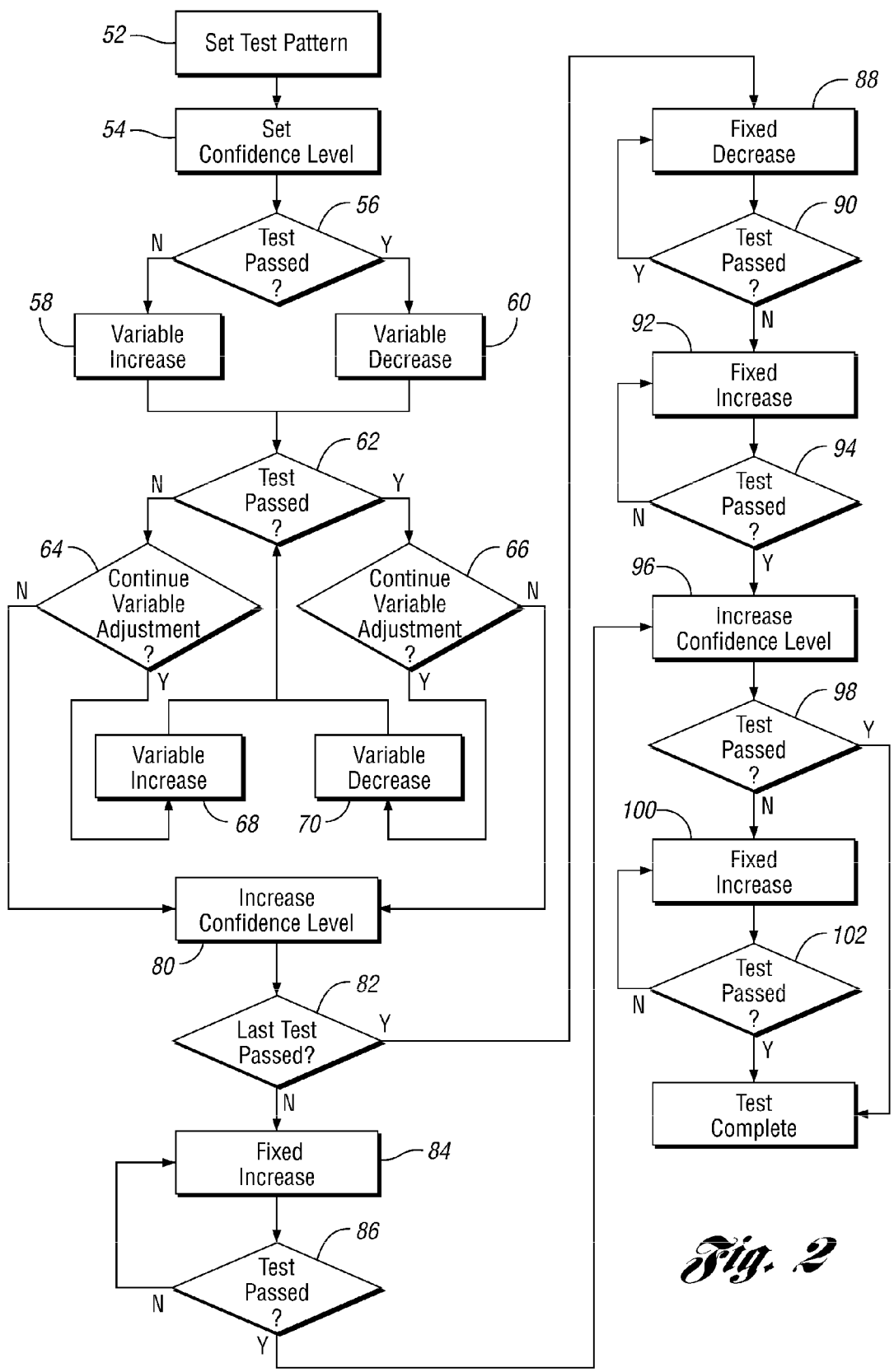
FIG. 2 illustrates a flowchart for a method of testing in accordance with one non-limiting aspect of the present invention.

FIG. 2 illustrates a flowchart 50 for a method of testing DUTs in accordance with one non-limiting aspect of the present invention. The illustrated method may be implemented with the configuration shown in FIG. 1 or some other configuration. The illustrated method may be advantageous in shortening the testing period required to test the DUT to failure.

Block 52 relates to setting a pattern generator or other device to produce the desired test pattern. This may include any number of operations, including identifying the DUT, the desired testing strategy, conditions (attenuation, jitter, etc.) and any number of other conditions. The above described test software may be configured to facilitate the selection process. The BERT, ISI board, attenuators, bias-Ts, and/or other features may need to be set and/or controlled to support the desired testing conditions. Because any number of components may be used and/or adjusted to achieve the desired test conditions, the source generating or otherwise responsible for providing the test signal/pattern to the DUT may be simply referred to as the pattern generator (PG).

Block 54 relates to setting a desired confidence level. The confidence level generally relates to a number of bits that need to be read from the DUT prior to assessing whether the DUT successfully processed the test pattern. A confidence level, typically expressed as a percentage, e.g. 95% confidence, is dependent on the bit rate (data rate), e.g. 4 Gb/s, and the desired bit error rate (BER), e.g. A BER of 1E-12. For a desired confidence level at a specified BER and for a given data rate, the test pattern must be applied to the DUT for some period time. Generally, the higher the confidence level, the longer the period of time.

Block 56 relates to determining whether the DUT successfully processed the test pattern. The DUT may be determined to having successfully passed the test if an output of the DUT in response to the test pattern properly matches a desired output signal. For example, the test signal may prompt the DUT to perform one or more desired operations. The signals generated upon completion of the desired operations may be compared to design values. If a sufficient number of the outputted signals match the design values, the DUT may be considered to have successfully passed the test.

Block 56 may optionally include repeatedly subjecting the DUT to the same test signal. Depending on the device being tested, operation parameters being tested, and any number of other considerations, a certain number of test samples run at the desired confidence level may be desired in order to insure accuracy. As such, the DUT may be repeatedly subjected to the same test pattern until a sufficient number of data sets are generated before assessing whether the test was successful. This can be helpful in assuring that the influence of erroneous errors and other anomalies are limited.

Depending on whether the DUT passed in Block 56, Blocks 58, 60 either increases or decreases one or more of the testing parameters. This, as described below in more detail, can be helpful in testing the DUT until failure. The DUT may be tested to failure in any suitable manner. One problem with testing the DUT to failure relates to accurately determining a failure point/threshold of the DUT. To accurately detect the failure point, it may be advantageous to precisely determine the change in operating conditions where the DUT transitions from operating properly to operating improperly. This process can be time consuming in system where the testing conditions are gradually changed at fixed intervals.

One non-limiting aspect of present invention contemplates a variable testing sequence where the test conditions are changed at a variable rate. For exemplary purposes, the present invention is predominately described with respect to varying the voltage amplitude of the differential signal used to test the DUT. The voltage amplitude may be increased and/or decreased to facilitate testing the DUT to failure. Other operating conditions, however, may be similarly adjusted in place of or in addition to the described voltage variation, such as but not limited to adjustments based on frequency, temperature, and noise.

The variable testing may be based on a halving or a bisection method of increasing and decreasing the voltage amplitude to test for pass and fail conditions. The voltage variation may be increased by half of the previous amplitude if the DUT fails while the voltage variation may be decreased by half if the DUT passes. Bisecting the previous voltage amplitude to increase or decrease the amplitude of subsequent tests may be repeated until any number of parameters indicates that continued bisecting of the voltage amplitude is unnecessary. While such a coarse method of determining the window of operation is described, the voltage amplitude need not be bisected. It may be adjusted according to other percentages or increments. The bisection method, however, may be advantageous in that is relatively easy to calculate and does not require the testing software to store a long history of voltage amplitudes in order to calculate the next voltage amplitude.

After each adjustment, whether it is by way of bisecting the previous amplitude or some other strategy, the DUT may be retested at Block 62 to determine a corresponding pass or fail. In this manner, a window of operation can be determined based on the previous test, i.e., if the re-test changes the operation from a pass to a fail, then the pass-fail threshold is somewhere between the two test values. With each test, the window becomes narrower. At some point, the voltage variation may reach a certain window size (precision) and/or have cycled through enough variations that additional adjustments are unnecessary or undesirable from a timing perspective.

Blocks 64, 66 relates to determining whether to continue making the adjustments noted in Blocks 58, 60. If the adjustments are desired, the test parameters are increase or decreased at Blocks 68, 70 in the manner described above (bisected) and the DUT is re-tested at Block 62. If further testing according to the variable adjustment processed described so far is not desired, the present invention contemplates transiting to a fixed adjustment process in order to more precisely identify the pass-fail threshold without the variability associated with the halving the last value or relying on some other algorithm that basis the next value on a prior value.

Block 80 is reached to begin testing according to a fixed adjustment strategy where the amplitude is increased or decreased according to a fixed value, instead of the variable value described above. The use of variable (bisecting) adjustment can be advantageous in quickly ascertaining a relative rough estimate of the pass-fail threshold. The fixed variable adjustment can be used to more precisely determine the threshold. A value difference between the last variable adjustment and the fixed adjustment variable may be a factor that can be used to assess whether continued variable adjustment is desired—continued variable may not be desired if the variable adjustment value equals the fixed adjustment value.

Block 80 relates to increasing the confidence level prior to beginning the fixed adjustment process. Like Block 54, the confidence level can be assigned according to any number of testing parameters and typically requires longer testing periods as the confidence level increases. One non-limiting aspect of the present invention contemplates a progressive approach where testing time may be gradually increased rather than initially or always testing at according to the highest confidence levels. This can be helpful in reducing the time taken to accurately test the DUT to failure.

Block 82 relates to an optional process of assessing whether the last test indicates the last tested voltage amplitude is associated with a pass or a fail condition. This differentiation may be used to facilitate testing DUTs that experience hysteresis of the type that results in the DUT passing a test at particular amplitude when the prior test was a pass and failing the same test at the same amplitude when the prior test was a fail. (Discharge/charging variables and other parameters of the DUT may operate differently as they are exposed to different voltage amplitudes.) The fixed adjustment portion contemplates an option where the window defining the boundaries of the pass-fail threshold may be determined only after an increase in amplitude. Block 82 makes the assessment of whether the last test was a pass or fail in order to more quickly proceed to subsequent portions of the test.

Blocks 84, 86 relate to increasing the voltage amplitude by a fixed value if the last test was a fail and retesting the DUT at the increased amplitude. If the DUT fails again, Blocks 84, 86 are repeated until a pass condition is reached. If the DUT reached Block 82 after a pass condition, Blocks 88, 90 are reached and the DUT is tested until a fail condition. Once the fail condition is met, Blocks 92, 94 are reached and the DUT is tested until another pass condition is met. This allows the present invention to optionally determine the window (defined according to the fixed variable used for each adjustment) after the DUT has been transitioned from a fail to a pass condition while being subjected to the adjustment associated with the fixed value.

Once the device has been tested from a fail to a pass condition after adjusting the amplitudes according to the fixed variable, Block 96 is reached. Block 96 relates to increasing the confidence level and retesting the DUT at the increased confidence level. The confidence level set in Block 96 may correspond with the final confidence level desired for the testing process. Instead of immediately testing according to this final confidence level, the present invention contemplates one non-limiting embodiment where the prior test are conducted at a lower confidence level in order to quickly narrower a range within which the pass-fail threshold lies before actually testing the DUT at the highest/final confidence level. This can be helpful in limiting the overall testing time.

With the confidence level set, Block 98 relates to determining whether the DUT passed the same test at the higher confidence level. If the DUT passed, the test is complete. If the DUT fails the test, Blocks 100, 102 are reached. Blocks 100, 102 relate to locating the pass-fail threshold at the highest confidence level. This includes sequentially increasing the amplitude by the fixed adjustment amount until the pass condition is reached. The process is complete once the DUT passes the test at the highest confidence level.

The fixed adjustment amount used above may be selected according to any criteria and testing parameters. It may optionally be tied to the confidence level selected in Blocks 80, 96. This may include selecting a less precise (larger) value if a lower confidence level is selected, selecting a more precise (smaller) value if a higher confidence level is selected, selecting a value that is dependent of the last variable value, such as but not limited to taking a percentage of the last variable value, and/or analyzing past test results and selecting the value to correspond with a desired balance between testing time and precision.

One non-limiting aspect of the present invention contemplates selecting the value of the fixed adjustment and using that value in all increases and decreases in amplitude. Of course, the present invention is not so limited and fully contemplates changing the fixed value when continuing the testing at different confidence levels.

As supported above, one non-limiting problem that this invention attempts to solve is how to use existing gigabit speed test equipment to reliably and accurately measure the receiver sensitivity of high speed serial devices when in the presences of both voltage and timing stresses. One non-limiting aspect of the present invention implements a time variable controlled searching algorithm for injecting voltage stresses and allows simultaneous timing stresses to be controlled in both frequency and amplitude.

One non-limiting aspect of the present invention proposes a method and apparatus that uses existing multi-gigabit speed lab test equipment to reliably and accurately measure the receiver sensitivity of integrated circuit (IC) high speed serial interfaces. The proposed method may use an automated test approach to acquire both signal swing and timing margining measurements based on a time variable controlled searching algorithm, which relates the test time to a statistical confidence level for the results at the data rate being evaluated. A test-to-fail strategy may be used with a comprehensive and flexible test setup that reveals the true performance of the DUT (device under test).

One non-limiting aspect of the present invention provides a cost-effective way to reliably and accurately evaluate the performance of high speed serial links, which closely resemble those seen in computer systems. Better understanding of the voltage and timing margins of these high speed links can result in more accurate data swing and timing budgets designed within a system. One non-limiting advantage of the proposed time variable searching algorithm is that it allows the user to configure the test in such a way that both test speed and accuracy can be balanced while obtaining repeatable and reliable data.

One non-limiting aspect of the present invention includes: 1) An automated time variable searching algorithm tied to a statistical confidence level. 2) A time-spaced self assured test methodology that ensures individual accuracy per run and reproducibility per test. 3) A test-to-fail approach which identifies weaknesses in the IC receiver design. 4) Both data swing margining and various types of timing (itter) margining in a system like environment. 5) Ability to test DC and AC coupled receivers. 6) Methods for isolating test instrument issues from the real test results. 7) Comprehensive system impairment injection, which includes crosstalk and power noise. 8) Ability to do all the aforementioned items while including the effects of channel to channel variations, voltage and temperature variations, part to part variations, and process variations.

The present invention may also be used to test or support the testing of different test pattern stimulus, different test patterns, process, voltage and temperature (PVT) variations, user patterns, de-emphasis, channel impairments, and/or DC bias points.

One non-limiting aspect of the present invention relates to an algorithm that uses increasing confidence levels for each of the three loops. The reason to continue testing at each stage may be that the second stage confidence level percentage is chosen to optimize more for time not accuracy, although the final value should be close after the second loop is completed. If the present invention tested every voltage amplitude for the full time required by a high confidence level each single pass/fail run would require much longer test times. By waiting until the third loop to test for the test time required by the final confidence level we can speed up the search and narrow down the values.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of assessing a pass-fail threshold for a device comprising:

determining the pass-fail threshold to be within one of a pass-side boundary and a fail-side boundary based on whether the device operated properly or improperly when repeatedly subjected to amplitude varied test signals, the pass-side boundary corresponding with test signals at which the device operated properly and the fail-side boundary corresponding with test signals at which the device operated improperly; and narrowing a range between the boundaries by increasing or decreasing the amplitude of the test signals depending on whether the device operated properly or improperly during the last test signal;

initially determining the boundaries by varying a value used to increase or decrease the amplitude of the test signal by a variable amount that changes for each test; and after initially determining the boundaries, more precisely defining the boundaries by varying the value used to increase or decrease the amplitude of the test signal by a fixed amount that remains fixed for each test.

2. The method of claim 1 further comprising a computer usable medium having a computer readable program code embodied and operable for determining the more precisely defined boundaries to correspond with boundaries determined after testing the device until it operates improperly and then until it operates properly.

3. The method of claim 1 further comprising a computer usable medium having a computer readable program code embodied and operable for initially determining the boundaries at one confidence level and then more precisely defining the boundaries at a greater confidence level.

4. The method of claim 1 further comprising a computer usable medium having a computer readable program code embodied and operable for analyzing less data bits to initially define the boundaries than to more precisely define the boundaries.

5. The method of claim 1 further comprising a computer usable medium having a computer readable program code embodied and operable for more precisely defining the boundaries when the variable amount equals the fixed amount.

6. The method of claim 1 further comprising automatically selecting the variable amount with a processor and to equal half of the amplitude of the last test.

7. The method of claim 6 further comprising waiting to more precisely define the boundaries until the variable amount is decreased to equal the fixed amount.

8. The method of claim 1 wherein more precisely defining the boundaries includes testing the device at one confidence level and then continuing to test the device at a greater confidence level, wherein the device is a receiver and is supplied test signals from a bit error rate tester (BERT).

9. A method of assessing a pass-fail threshold for a device comprising:

at an initial confidence level, defining operating boundaries on either side of the pass-fail threshold according to whether the device operated properly or improperly when repeatedly tested, wherein an amplitude of a differential test signal is increased or decreased for each test by half the amplitude of the previous test; and at a greater confidence level, more precisely defining operating boundaries on either side of the pass-fail threshold according to whether the device operated properly or improperly when repeatedly tested, wherein the amplitude of the differential test signal is increased or decreased for each test by a fixed amount;

continuing to test the device at the greater confidence level until the device transitions from a fail to a pass; and after the device transitions from the fail to the pass, testing the device at an even greater confidence level and at the amplitude of the last test, completing assessment of the pass-fail threshold if the device passes and delaying completing the assessment until the device passes at the even greater confidence level wherein the amplitude of the test signal is increased by the fixed amount for each test increasing by the fixed amount until the device passes before completion.

10. The method of claim 9 further comprising waiting to more precisely define the boundaries until a value equal to an amount by which the last amplitude was halved equals the fixed amount, wherein the device is a receiver and is supplied test signals from a bit error rate tester (BERT).

11. The method of claim 9 further comprising introducing noise into the test signal.

12. The method of 9 further comprising bypassing requiring the device to transition from the fail to the pass condition if hysteresis is acceptable.

13. The method of 9 further comprising simultaneously testing additional devices or additional channels of the device with the test signal, wherein each device or channel is tested at the same amplitude and confidence level.

14. The method of 9 wherein the device is an integrated circuit.

15. The method of 9 wherein the initial confidence level is at least 10%, the greater confidence level is at least 30%, and the even greater confidence level is 95%.

16. The method of claim 9 wherein the even greater confidence level is at least 95%.

17. A method of testing a device comprising:
electronically determining the device to have one of passed and failed a first test depending on whether a first output signal of the device generated in response to application of a first test signal at a first amplitude sufficiently matches with a first test output;

electronically determining the device to have one of passed and failed a second test depending on whether a second output signal of the device generated in response to application of the first test signal at a second amplitude sufficiently matches with the first test output, the second amplitude being a first amount less than the first amplitude in the event the first test was passed and the first amount greater than the first amplitude in the event the first test was failed; and electronically determining the device to have one of passed and failed a third test depending on whether a third output signal of the device generated in response to application of a second test signal sufficiently matches with a third test output.

18. The method of claim 17 further comprising, prior to electronically determining the device to have one of passed and failed the third test, electronically determining a first passed boundary and a first failed boundary based on the device having passed and failed one or more additional tests conducted in sequence after the first and second tests, each additional test increasing an amplitude of the first test signal by an amount equal to half the amplitude of the prior test in the event the prior test was failed and decreasing the amplitude by the same amount in the event the prior test was passed, the additional tests being conducted until the device is determined to have passed one test following one failed test, the first passed boundary being determined to be the amplitude of the last passed test and the first failed boundary being determined to be the amplitude of the last failed test.

19. The method of claim 17 further comprising
after electronically determining the device to have one of passed and failed the third test, electronically determining a second passed boundary and a second failed boundary based on the device having passed and failed one or more further additional tests conducted in sequence after the additional tests, each additional test increasing an amplitude of the first test signal by a fixed amount in the event the prior test was failed and decreasing the amplitude by the fixed amount in the event the prior test was passed, the further additional tests being conducted until the device is determined to have passed one test following one failed test, the second passed boundary being determined to be the amplitude of the last passed test and the failed boundary being determined to be the amplitude of the last failed test; and after electronically determining the second passed boundary and the second failed boundary, electronically determining the device to have one of passed and failed a fourth test depending on whether a fourth output signal of the device generated in response to application of a third test signal sufficiently matches with a third test output.

20. The method of claim 19 wherein:
a third amplitude of the third test is a second amount less than the amplitude of the last prior test in the event the last prior test was passed and the second amount greater than the amplitude of the last prior test in the event the last prior test was failed;

a fourth amplitude of the fourth test is the amplitude of the last prior test in the event the last prior test was passed and a third amount greater than the amplitude of the last prior test in the event the last prior test was failed;

the first amount is half of the first amplitude and the second amount is greater than the third amount;

the second test signal is longer than the first test signal and the third test signal is longer than the second test signal; and wherein the device is a receiver and is supplied test signals from a bit error rate tester (BERT).

* * * * *